(12) United States Patent
Park

(10) Patent No.: US 10,854,841 B2
(45) Date of Patent: Dec. 1, 2020

(54) FLEXIBLE DISPLAY APPARATUS HAVING A PROTECTIVE FILM

(71) Applicant: LG Display Co., Ltd., Seoul (KR)

(72) Inventor: Joonwon Park, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/719,145

(22) Filed: Dec. 18, 2019

(65) Prior Publication Data

US 2020/0212327 A1   Jul. 2, 2020

(30) Foreign Application Priority Data

Dec. 27, 2018   (KR) .......................... 10-2018-0170752

(51) Int. Cl.
```
H01L 51/52    (2006.01)
H01L 51/00    (2006.01)
H01L 27/32    (2006.01)
```
(52) U.S. Cl.
CPC ...... *H01L 51/5246* (2013.01); *H01L 51/0097* (2013.01); *H01L 51/5253* (2013.01); *H01L 27/32* (2013.01); *H01L 51/5237* (2013.01); *H01L 2251/5338* (2013.01)

(58) Field of Classification Search
None
See application file for complete search history.

(56) References Cited

U.S. PATENT DOCUMENTS

| | | | |
|---|---|---|---|
| 2012/0153333 A1* | 6/2012 | Yamazaki | H01L 51/5253 257/98 |
| 2017/0229665 A1* | 8/2017 | Park | H01L 51/5253 |
| 2017/0309843 A1* | 10/2017 | Kim | B32B 3/266 |
| 2018/0248139 A1* | 8/2018 | Zhai | H01L 51/0097 |
| 2019/0036076 A1* | 1/2019 | Tang | H01L 51/0097 |

\* cited by examiner

*Primary Examiner* — Steven B Gauthier
(74) *Attorney, Agent, or Firm* — Birch, Stewart, Kolasch & Birch, LLP

(57) ABSTRACT

A flexible display apparatus including a protective film is provided. The protective film can include penetrating holes extending in parallel in a direction perpendicular to a bending direction. Deformation preventing elements having the modulus of elasticity higher than the protective film can be disposed in the penetrating holes of the protective film. The protective film and the deformation preventing elements can be coupled with a device substrate including a light-emitting device, an encapsulating layer and a barrier layer, which are sequentially stacked on the device substrate by an adhesive layer. The adhesive layer can include a first adhesive element overlapping with the protective film, and second adhesive elements overlapping with the deformation preventing elements. The second adhesive elements can have the modulus of elasticity lower than the first adhesive element. Thus, in the flexible display apparatus, the deformation of the protective film due to a bending stress can be prevented.

14 Claims, 4 Drawing Sheets

FLEXIBLE DISPLAY APPARATUS HAVING A PROTECTIVE FILM

CROSS-REFERENCE TO RELATED APPLICATION

This application claims the priority benefit of Korean Patent Application No. 10-2018-0170752, filed on Dec. 27, 2018 in the Republic of Korea, which is hereby incorporated by reference as if fully set forth herein.

BACKGROUND OF THE INVENTION

Field of the Invention

The present invention relates to a flexible display apparatus in which a barrier layer, an adhesive layer and a protective film are sequentially stacked on an encapsulating layer covering a light-emitting device.

Discussion of the Related Art

A display apparatus including a light-emitting device can include an encapsulating layer to prevent damage of the light-emitting device due to external moisture and impact. The display apparatus can be bent for a user's convenience or design and such apparatus can be referred to as a flexible display apparatus. The flexible display apparatus can include an encapsulating layer, as well as a barrier layer, an adhesive layer and a protective film which are sequentially stacked on the encapsulating layer.

The barrier layer can prevent the permeation of the external moisture. For example, the barrier layer can include a metal. The protective film can be attached to the barrier layer by the adhesive layer. The impact applied to the light-emitting device due to external force can be relieved by the protective film. The protective film can include an insulating material. For example, the protective film can include poly-ethylene terephthalate (PET) resin.

However, in the flexible display apparatus, since compression or expansion stress due to bending is most applied to the protective film which is disposed at the outermost part, the deformation of the protective film can occur due to such bending stress. Also, the protective film can shrink at a specific temperature. Thus, in the general flexible display apparatus, warpage due to heat shrinkage of the protective film can occur.

SUMMARY OF THE INVENTION

Accordingly, the present invention is directed to a flexible display apparatus that substantially obviates one or more problems due to limitations and disadvantages of the related art.

An object of the present invention is to provide a flexible display apparatus preventing deformation of a protective film due to bending stress.

Another object of the present invention is to provide a flexible display apparatus capable of minimizing stresses applied to the protective film.

Additional advantages, objects, and features of the invention will be set forth in part in the description which follows and in part will become apparent to those having ordinary skill in the art upon examination of the following or can be learned from practice of the invention. The objectives and other advantages of the invention can be realized and attained by the structure particularly pointed out in the written description and claims hereof as well as the appended drawings.

To achieve these objects and other advantages and in accordance with the purpose of the invention, as embodied and broadly described herein, there is provided a flexible display apparatus including a light-emitting device on a device substrate. An encapsulating layer is disposed on the device substrate. The encapsulating layer covers the light-emitting device. A barrier layer is disposed on the encapsulating layer. An adhesive layer is disposed on the barrier layer. The adhesive layer includes a first adhesive element and second adhesive elements. The second adhesive elements have the modulus of elasticity lower than the first adhesive element. A protective film is disposed on the first adhesive element. The protective film includes penetrating holes overlapping with the second adhesive elements. Deformation preventing elements are disposed on the second adhesive elements. The deformation preventing elements have the modulus of elasticity higher than the protective film. The second adhesive elements and the penetrating holes of the protective film extend in parallel in a direction.

The coefficient of thermal expansion of the deformation preventing elements can be lower than the coefficient of thermal expansion of the protective film.

The deformation preventing elements can include an insulating material.

The deformation preventing elements can include a thermosetting resin.

A horizontal distance of each second adhesive element can be the same as the distance between adjacent second adhesive elements.

Each of the deformation preventing elements can have a vertical thickness same as the protective film.

A horizontal distance of each deformation preventing element can be smaller than a distance between adjacent deformation preventing elements.

The horizontal distance of each deformation preventing element can be smaller than a horizontal distance of each second adhesive element.

In another embodiment, a flexible display apparatus includes a light-emitting device on a device substrate. An encapsulating layer is disposed on the device substrate. The encapsulating layer covers the light-emitting device. A barrier layer is disposed on the encapsulating layer. A protective film is disposed on the barrier layer. The protective film includes penetrating holes which extend in parallel. A first adhesive element is disposed between the barrier layer and the protective film. The first adhesive element has the modulus of elasticity higher than the protective film. Deformation preventing elements are disposed in the penetrating holes of the protective film. The deformation preventing elements have the modulus of elasticity higher than the protective film. Second adhesive elements are disposed between the barrier layer and the deformation preventing elements. The second adhesive elements have the modulus of elasticity lower than the deformation preventing elements.

A vertical thickness of each second adhesive element can be the same as a vertical thickness of each first adhesive element.

A side surface of each second adhesive element can be vertically aligned with a side surface of each deformation preventing element.

The second adhesive elements can include a material same as the deformation preventing elements. The density of each second adhesive element can be lower than the density of each deformation preventing element.

The modulus of elasticity of the second adhesive elements can be smaller than the modulus of elasticity of the protective film.

The modulus of elasticity of the first adhesive element can be smaller than the modulus of elasticity of the deformation preventing elements.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE EMBODIMENTS

Figure 1A:
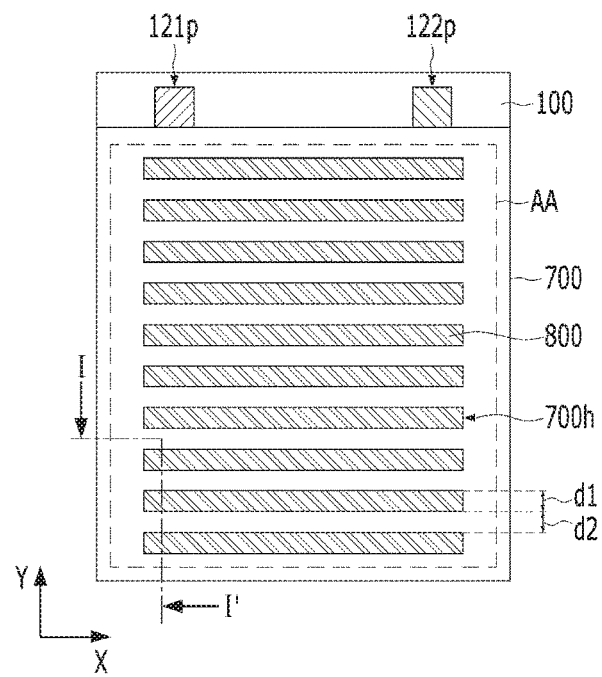
FIG. 1A is a view schematically showing a flexible display apparatus according to an embodiment of the present invention.

Hereinafter, details related to the above objects, technical configurations, and operational effects of the embodiments of the present invention will be clearly understood by the following detailed description with reference to the drawings, which illustrate some embodiments of the present invention. Here, the embodiments of the present invention are provided in order to allow the technical sprit of the present invention to be satisfactorily transferred to those skilled in the art, and thus the present invention can be embodied in other forms and is not limited to the embodiments described below.

In addition, the same or extremely similar elements can be designated by the same reference numerals throughout the specification, and in the drawings, the lengths and thickness of layers and regions can be exaggerated for convenience. It will be understood that, when a first element is referred to as being "on" a second element, although the first element can be disposed on the second element so as to come into contact with the second element, a third element can be interposed between the first element and the second element.

Here, terms such as, for example, "first" and "second" can be used to distinguish any one element with another element. However, the first element and the second element can be arbitrary named according to the convenience of those skilled in the art without departing the technical sprit of the present invention.

The terms used in the specification of the present invention are merely used in order to describe particular embodiments, and are not intended to limit the scope of the present invention. For example, an element described in the singular form is intended to include a plurality of elements unless the context clearly indicates otherwise. In addition, in the specification of the present invention, it will be further understood that the terms "comprises" and "includes" specify the presence of stated features, integers, steps, operations, elements, components, and/or combinations thereof, but do not preclude the presence or addition of one or more other features, integers, steps, operations, elements, components, and/or combinations.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Embodiments

Figure 1B:
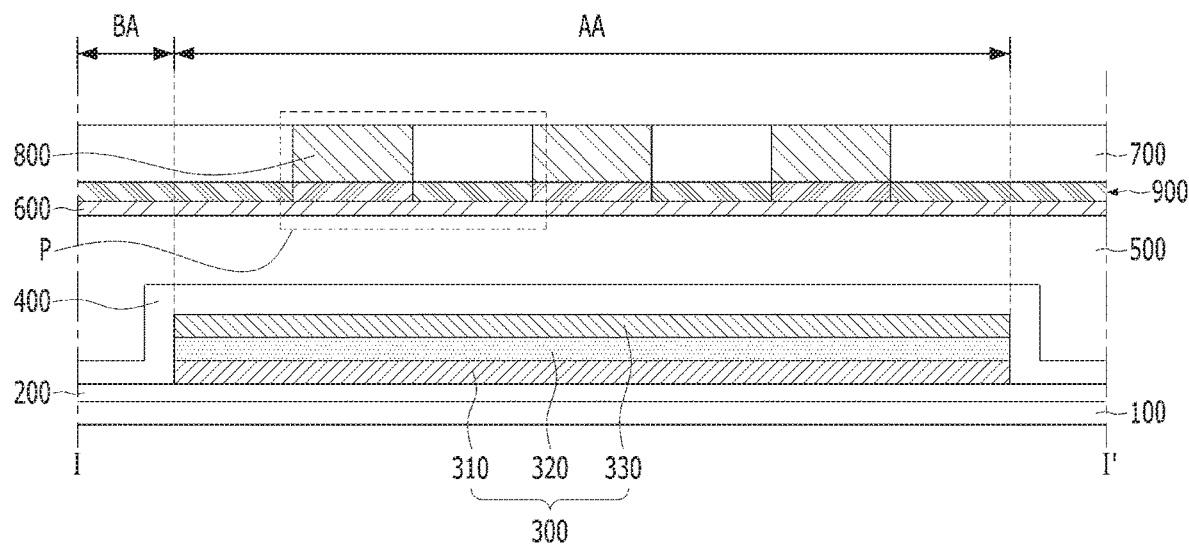
FIG. 1B is a view taken along I-I' of FIG. 1A.
Figure 2:
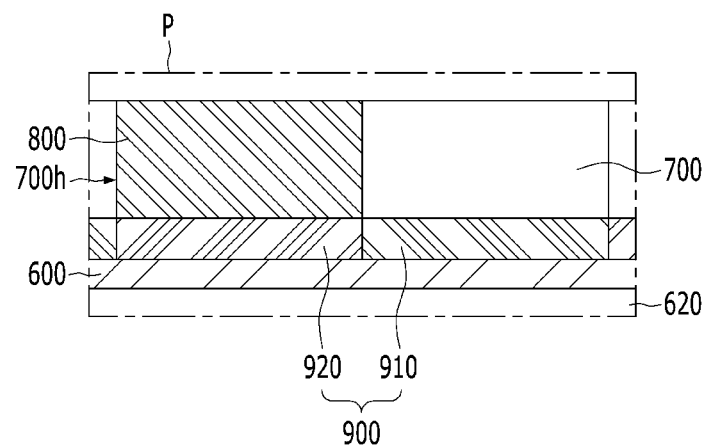
FIG. 2 is an enlarged view of P region in FIG. 1B.
Figure 3:
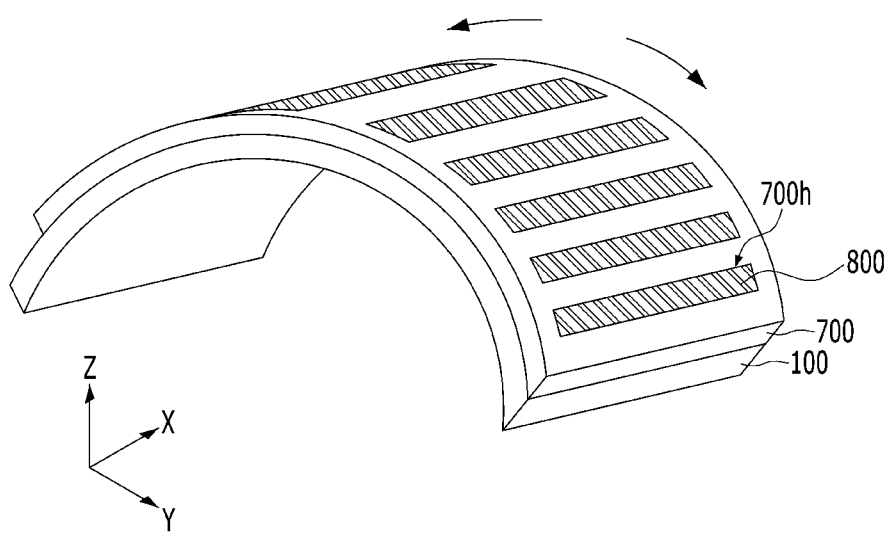
FIG. 3 is a view showing a bent state of the flexible display apparatus according to the embodiment of the present invention.

FIG. 1A is a view schematically showing a flexible display apparatus according to an embodiment of the present invention. FIG. 1B is a view taken along I-I' of FIG. 1A. FIG. 2 is an enlarged view of P region in FIG. 1B. FIG. 3 is a view showing a bent state of the flexible display apparatus according to the embodiment of the present invention. All the components of the flexible display device according to all embodiments of the present invention are operatively coupled and configured.

Referring FIGS. 1A, 1B, 2 and 3, the flexible display apparatus according to the embodiment of the present invention can include a device substrate 100. The device substrate 100 can include an insulating material. The device substrate 100 can include a material being relatively easily bent. For example, the device substrate 100 can include plastic.

The device substrate 100 can include a display area AA and a bezel area BA. The display area AA can emit light according to user's request. For example, at least one light-emitting device 300 can be disposed on the display area AA of the device substrate 100.

The light-emitting device 300 can emit light displaying a specific color. For example, the light-emitting device 300 can include a first electrode 310, a light-emitting layer 320 and a second electrode 330, which are sequentially stacked on the device substrate 100.

The first electrode 310 can include a conductive material. The first electrode 310 can include a transparent material. For example, the first electrode 310 can be a transparent electrode formed of a transparent conductive material, such as ITO and IZO.

The light-emitting layer 320 can generate light having luminance corresponding to a voltage difference between the first electrode 310 and the second electrode 330. For example, the light-emitting layer 320 can include an emission material layer (EML) having an emission material. The emission material can include an organic material. For example, the flexible display apparatus according to the embodiment of the present invention can be an organic light-emitting display apparatus having the light-emitting layer 320 formed of the organic material.

The second electrode 330 can include a conductive material. The second electrode 330 can include a material different from the first electrode 310. The second electrode 330 can include a material having a high reflectance. For example, the second electrode 330 can include a metal, such as aluminum (Al) and silver (Ag). Thus, in the flexible display apparatus according to the embodiment of the present invention, the light generated from the light-emitting layer 320 can be emitted to outside through the first electrode 310 and the device substrate 100.

The light emitted from the light-emitting devices 300 on the display area AA on the device substrate 100 can display the same color. For example, the display area AA of the device substrate 100 can be covered by a single light-emitting device 300. The first electrode 310, the light-emitting layer 320 and the second electrode 330 of the light-emitting device 300 can include a region overlapping with the display area AA of the device substrate 100. For example, the flexible display apparatus according to the embodiment of the present invention can be a lighting device realizing a specific color according to a user's request.

The bezel area BA can be disposed outside the display area AA. The display area AA can receive a signal from the bezel area BA according to the user's request. For example, a first pad 121p connected to the first electrode 310 of the light-emitting device 300 and a second pad 122p connected to the second electrode 330 of the light-emitting device 300 can be disposed on the bezel area BA of the device substrate 100.

A buffer layer 200 can be disposed between the device substrate 100 and the light-emitting device 300. The buffer layer 200 can prevent the pollution due to the device substrate 100 in the process of forming the light-emitting device 300. The buffer layer 200 can have a size larger than the light-emitting device 300. For example, a surface of the device substrate 100 toward the light-emitting device 300 can be completely covered by the buffer layer 200.

The buffer layer 200 can include an insulating material. For example, the buffer layer 200 can include an inorganic insulating material, such as silicon oxide (SiO) and silicon nitride (SiN). The buffer layer 200 can have a multi-layer structure. For example, the buffer layer 200 can have a stacked structure of insulating layers having different refractive indices. Each insulating layer of the buffer layer 200 can have refractive index similar to adjacent insulating layers of the buffer layer 200. Thus, in the flexible display apparatus according to the embodiment of the present invention, loss of the light due to the buffer layer 200 can be minimized.

An encapsulating layer 500 can be disposed on the light-emitting device 300. The encapsulating layer 500 can prevent the damage of the light-emitting device 300 due to the external impact and moisture. The encapsulating layer 500 can extend on the bezel region of the device substrate 100. For example, the light-emitting device 300 can be covered by the encapsulating layer 500. The encapsulating layer 500 can surround a side surface of the light-emitting device 300. For example, the display area AA can be disposed in the bezel area BA. The bezel area BA can extend along an edge of the display area AA.

The encapsulating layer 500 can remove the thickness difference due to the light-emitting device 300. For example, a surface of the encapsulating layer 500 opposite to the device substrate 100 can be a flat surface. A vertical thickness of the encapsulating layer 500 on the light-emitting device 300 can be thinner than a vertical thickness of the encapsulating layer 500 on the bezel area BA of the device substrate 100.

The encapsulating layer 500 can include an insulating material. For example, the encapsulating layer 500 can include an organic insulating material.

A capping layer 400 can be disposed between the light-emitting device 300 and the encapsulating layer 500. The capping layer 400 can extend on the bezel area BA of the device substrate 100. For example, the capping layer 400 can be in contact with the buffer layer 200 and the encapsulating layer 500 on the bezel area BA of the device substrate 100.

The capping layer 400 can include an insulating material. The capping layer 400 can include a material different from the encapsulating layer 500. For example, the capping layer 400 can include an inorganic insulating material. Thus, in the flexible display apparatus according to the embodiment of the present invention, the damage of the light-emitting device 300 due to the external impact and moisture can be effectively prevented.

A barrier layer 600 can be disposed on the encapsulating layer 500. The barrier layer 600 can block the permeation of the external moisture. The barrier layer 600 can have a water vapor transmission rate (WVTR) lower than the encapsulating layer 500. For example, the barrier layer 600 can include a metal, such as copper (Cu). The external force applied to the light-emitting device 300 through the encapsulating layer 500 can be relieved by the barrier layer 600.

A protective film 700 can be disposed on the barrier layer 600. The protective film 700 can prevent the damage of the barrier layer 600 due to the external force and the foreign matter. The protective film 700 can overlap the display area AA and the bezel area BA of the device substrate 100. The surface of the barrier layer 600 opposite to the device substrate 100 can be completely covered by the protective film 700.

The protective film 700 can include an insulating material. For example, the protective film 700 can include poly-ethylene terephthalate (PET) resin.

The protective film 700 can include penetrating holes 700h. The penetrating holes 700h of the protective film 700 can extend in parallel in a direction. For example, the penetrating holes 700h of the protective film 700 can be extend in a first direction X connected between the first pad 121p and the second pad 122p. Thus, when the flexible display apparatus according to the embodiment of the present invention is bent in a second direction Y perpendicular to the first direction X, the bending stress applied to the protective film 700 in the second direction Y can be blocked the penetrating holes 700h. Thereby, in the flexible display apparatus according to the embodiment of the present invention, the deformation of the protective film 700 due to the bending stress can be minimized.

The penetrating holes 700h can be disposed in the display area AA of the device substrate 100. A horizontal distance d1 of each penetrating hole 700h can be the same. A distance d2 between adjacent penetrating holes 700h can be a constant. For example, the horizontal distance d1 of each penetrating hole 700h can be the same as the distance d2 between adjacent penetrating holes 700h.

Deformation preventing elements 800 can be disposed in the penetrating holes 700h of the protective film 700, respectively. Each of the deformation preventing elements 800 can extend in a direction same as the corresponding penetrating hole 700h of the protective film 700. The deformation preventing elements 800 can include an insulating material. The deformation preventing elements 800 can include a material having a relatively small deformation by external force as compared with the protective film 700. For example, the modulus of elasticity of the deformation preventing elements 800 can be larger than that of the protective film 700. Thus, in the flexible display apparatus according to the embodiment of the present invention, the deformation of the protective film 700 due to the bending stress can be prevented by the deformation preventing elements 800.

The deformation preventing elements 800 can have the coefficient of thermal expansion lower than the protective film 700. For example, the deformation preventing elements 800 can include a thermosetting resin. Thus, in the flexible display apparatus according to the embodiment of the present invention, warpage due to heat shrinkage of the protective film 700 can be prevented by the deformation preventing elements 800.

Each penetrating hole 700h of the protective film 700 can be completely filled by the corresponding deformation preventing element 800. A horizontal distance of each deformation preventing element 800 can be the same as the horizontal distance d1 of each penetrating hole 700h. A distance between adjacent deformation preventing elements 800 can be the same as the distance d2 between adjacent penetrating holes 700h. Thus, in the flexible display apparatus according to the embodiment of the present invention, curbing the deformation of protective film 700 by the deformation preventing elements 800 can be made uniform. Thereby, in the flexible display apparatus according to the embodiment of the present invention, the deformation of the protective film 700 due to the external force can be efficiently prevented.

Each of the deformation preventing elements 800 can have a vertical thickness same as the protective film 700. For example, a method of forming the flexible display apparatus according to the embodiment of the present invention can include a step of forming the penetrating holes 700h in the protective film 700, a step of depositing a material for forming the deformation preventing elements 800 on the protective film 700 in which the penetrating holes 700h are formed, a step of curing the material for forming the deformation preventing elements 800, a step of removing a region of the material for forming the deformation preventing elements 800 which protrudes from the protective film 700 in order to the deformation preventing elements 800 in the penetrating holes 700h of the protective film 700, and a step of attaching the protective film 700 in which the penetrating holes 700h are filled by the deformation preventing elements 800 on the barrier layer 600 using an adhesive layer 900. Thus, in the flexible display apparatus according to the embodiment of the present invention, the thickness variation due to the deformation preventing elements 800 can be prevented. Thereby, in the flexible display apparatus according to the embodiment of the present invention, the bending stress due to the thickness variation can be prevented or significantly reduced.

The adhesive layer 900 can include a first adhesive element 910 between the barrier layer 600 and the protective film 700, and second adhesive elements 920 overlapping with the penetrating holes 700h of the protective film 700. For example, the second adhesive elements 920 can extend in the first direction X. The barrier layer 600 and the deformation preventing elements 800 can be in direct contact with the second adhesive elements 920. Each of the deformation preventing elements 800 can be attached to the barrier layer 600 by the corresponding second adhesive element 920.

The second adhesive elements 920 can include a material different from the first adhesive element 910. For example, the second adhesive elements 920 can have the modulus of elasticity lower than the first adhesive element 910. Thus, in the flexible display apparatus according to the embodiment of the present invention, the stress variation applied the light-emitting device 300 due to the difference of physical properties between the protective film 700 and the deformation preventing elements 800 can be relieved by the adhesive layer 900. For example, in the flexible display apparatus according to the embodiment of the present invention, the protective film 700 having a relative small modulus of elasticity can be attached to the barrier layer 600 by the first adhesive element 910 having a relative high modulus of elasticity, and the deformation prevent elements 800 having a relative high modulus of elasticity can be attached to the barrier layer 600 by the second adhesive elements 920 having a relative small modulus of elasticity, so that the deformation difference between the protective film 700 and the deformation preventing elements 800 due to the external force can be relieved by the deformation difference between the first adhesive element 910 and the second adhesive elements 920. Thereby, in the flexible display apparatus according to the embodiment of the present invention, damage of the light-emitting device 300 due to the deformation preventing elements 800 can be prevented or minimized.

The boundaries between the first adhesive element 910 and the second adhesive elements 920 can be vertically aligned with side surfaces of the deformation preventing elements 800. For example, each of second adhesive elements 920 can have a horizontal distance same as the horizontal distance d1 of the corresponding deformation preventing element 800. A distance between adjacent second adhesive elements 920 can be the same as the distance d2 between adjacent deformation preventing elements 800. Thus, in the flexible display apparatus according to the embodiment of the present invention, the damage of the light-emitting device 300 due to the deformation difference between the protective film 700 and the deformation preventing elements 800 can be efficiently prevented.

Accordingly, the flexible display apparatus according to the embodiment of the present invention can comprise the protective film 700 in which the penetrating holes 700h are formed, and the deformation preventing elements 800 in the penetrating holes 700s of the protective film 700. Thus, in the flexible display apparatus according to the embodiment of the present invention, the deformation of the protective film 700 due to the external force can be prevented. Further, in the flexible display apparatus according to the embodiment of the present invention, the adhesive layer 900 attaching the protective film 700 and the deformation preventing elements 800 to the barrier layer 600 can include the first adhesive element 910 overlapping with the protective film 700, and second adhesive elements 920 overlapping with the deformation preventing elements 800, the second adhesive elements 920 having the modulus of elasticity lower than the first adhesive element 910. Thus, in the flexible display apparatus according to the embodiment of the present invention, the deformation of the protective film 700 due to the external force, and the damage of the light-emitting device 300 due to the physical variation between the protective film 700 and the deformation preventing elements 800 can be prevented.

The flexible display apparatus according to the embodiment of the present invention is described that the penetrating holes 700h of the protective film 700 extend in the first direction X. However, in the flexible display apparatus according to another embodiment of the present invention, the extending direction of the penetrating holes 700h of the protective film 700 can be changed in a direction perpendicular to the bending direction.

Figure 4:
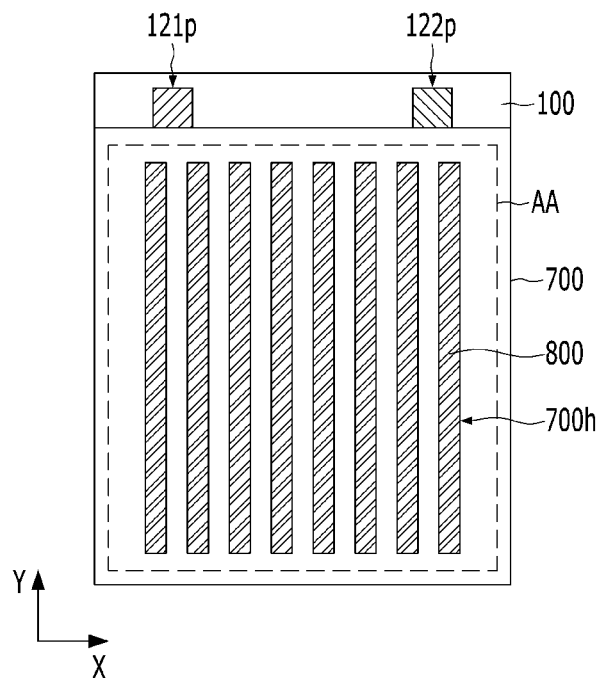
FIGS. 4 to 7 are views respectively showing a flexible display apparatus according to another embodiment of the present invention.
Figure 5:
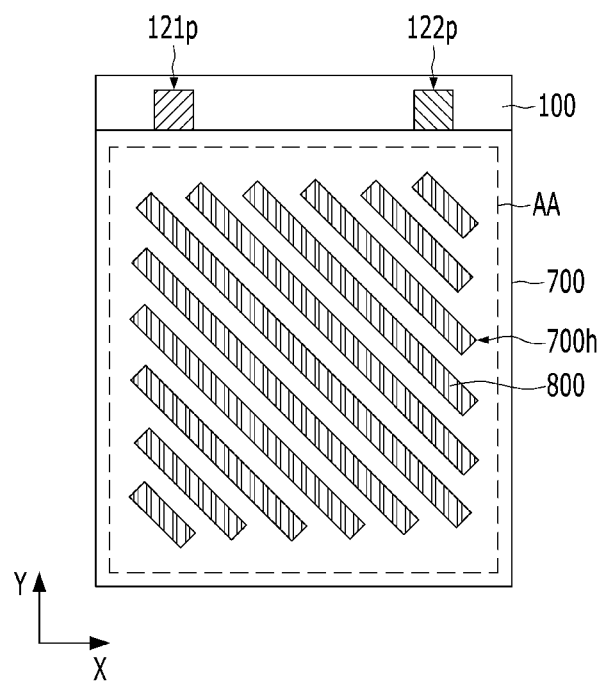

For example, in the flexible display apparatus according to another embodiment of the present invention which is bent in the first direction X, the penetrating holes 700h of the protective film 700 and the deformation preventing elements 800 can extend in the second direction Y perpendicular to the first direction X, as shown in FIG. 4. In the flexible display apparatus according to another embodiment of the present invention which is twisted in the first direction X and the second direction Y perpendicular to the first direction X, the penetrating holes 700h of the protective film 700 and the deformation preventing elements 800 can extend in an oblique direction, as shown in FIG. 5. For instance, in the flexible display apparatus according to another embodiment of the present invention, the penetrating holes 700h of the protective film 700 and the deformation preventing elements 800 can have various shapes according to the bending direction. Thus, in the flexible display apparatus according to another embodiment of the present invention, the deformation of the protective film 700 due to the external force can be efficiently prevented by the deformation preventing elements 800.

The flexible display apparatus according to the embodiment of the present invention is described that the first adhesive element 910 and the second adhesive elements 920 constitute the adhesive layer 900. However, the flexible display apparatus according to another embodiment of the present invention can include the second adhesive elements 920 formed of a material different from a first adhesive element 910.

Figure 6:
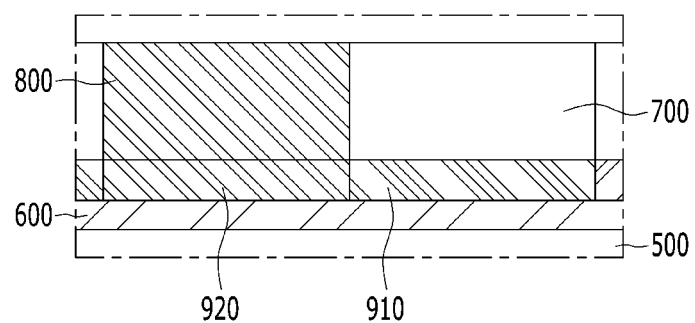

For example, in the flexible display apparatus according to another embodiment of the present invention, the second adhesive elements 920 can include a material same as the deformation preventing elements 800, as shown in FIG. 6. The second adhesive elements 920 can have a density different from the deformation preventing elements 800. For example, a method of forming the flexible display apparatus according to another embodiment of the present invention can include a step of attaching the first adhesive element 910 to the protective film 700, a step of forming holes penetrating the protective film 700 and the first adhesive element 910, and a step of filling the holes penetrating the protective film 700 and the first adhesive element 910, wherein the step of filling the holes penetrating the protective film 700 and the first adhesive element 910 can include a step of changing a density of the material after forming the second adhesive elements 920 by filling a portion of each hole in the first adhesive element 910.

The density of the second adhesive elements 920 can be smaller than the deformation preventing elements 800. For example, the second adhesive elements 920 can have the modulus of elasticity lower than the protective film 700 and the deformation preventing elements 800. The modulus of elasticity of the first adhesive element 910 higher than that of the second adhesive elements 920 can be a value between that of the protective film 700 and that of the deformation preventing elements 800. Thus, in the flexible display apparatus according to another embodiment of the present invention, the process of forming the second adhesive elements 920 can be simplified, and the degree of freedom of materials of the first adhesive element 910 can be improved.

Thereby, in the flexible display apparatus according to another embodiment of the present invention, the damage of the light-emitting device 300 due to the deformation difference between the protective film 700 and the deformation preventing elements 800 can be efficiently prevented.

The flexible display apparatus according to the embodiment of the present invention is described that the horizontal distance d1 of each deformation preventing element 800 is the same as the distance d2 between adjacent deformation preventing elements 800. However, in the flexible display apparatus according to another embodiment of the present invention, rate of the horizontal distance of each deformation preventing element and the distance between adjacent deformation preventing elements can be changed according to the elastic modulus difference between the protective film 700 and the deformation preventing elements 800.

Figure 7:
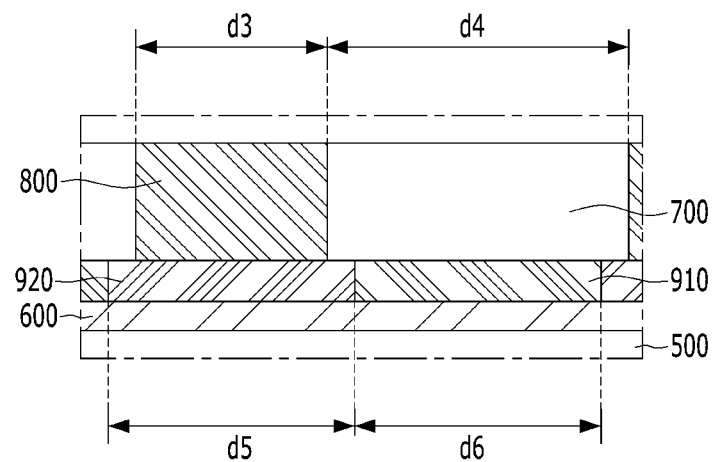

For example, in the flexible display apparatus according to another embodiment of the present invention, the horizontal distance d3 of each deformation preventing element 800 can be smaller than the distance d4 between adjacent deformation preventing elements 800, as shown in FIG. 7. The horizontal distance d3 of each deformation preventing element 800 can be smaller than the horizontal distance d5 of each second adhesive element 920. The distance d4 between adjacent deformation preventing elements 800 can be larger than the distance d6 between adjacent the second adhesive elements 920. Thus, in the flexible display apparatus according to another embodiment of the present invention, the stress variation due to the physical difference between the protective film 700 and the deformation preventing elements 800 can be efficiently relieved by the physical difference between the first adhesive element 910 and the second adhesive elements 920.

As a result, the flexible display apparatus according to the embodiments of the present invention can include the protective film having the penetrating holes which extend in parallel in a direction perpendicular to the bending direction, and the deformation preventing elements in the penetrating holes of the protective film, wherein the deformation preventing elements can have the modulus of elasticity higher than the protective film. Thus, in the flexible display apparatus according to the embodiments of the present invention, the deformation of the protective film due to the bending stress can be prevented by the deformation preventing elements. Further, in the flexible display apparatus according to the embodiments of the present invention, the second adhesive elements attaching the deformation preventing elements to the barrier layer can have the modulus of elasticity lower than the first adhesive element attaching the protective film to the barrier layer. Thereby, in the flexible display apparatus according to the embodiments of the present invention, the stress applied to the light-emitting device due to the physical difference between the protective film and the deformation preventing elements can be relieved by the physical difference between the first adhesive element and the second adhesive elements.

What is claimed is:
1. A flexible display apparatus comprising:
a light-emitting device on a device substrate;
an encapsulating layer on the device substrate, the encapsulating layer covering the light-emitting device;
a barrier layer on the encapsulating layer;
an adhesive layer on the barrier layer, the adhesive layer including a first adhesive element and second adhesive elements having a modulus of elasticity lower than the first adhesive element;
a protective film on the first adhesive element, the protective film including penetrating holes overlapping with the second adhesive elements; and
deformation preventing elements on the second adhesive elements, the deformation preventing elements having a modulus of elasticity higher than the protective film, wherein the second adhesive elements and the penetrating holes of the protective film extend in parallel in a direction.

2. The flexible display apparatus according to claim 1, wherein a coefficient of thermal expansion of the deformation preventing elements is lower than a coefficient of thermal expansion of the protective film.

3. The flexible display apparatus according to claim 1, wherein the deformation preventing elements include an insulating material.

4. The flexible display apparatus according to claim 3, wherein the deformation preventing elements include a thermosetting resin.

5. The flexible display apparatus according to claim 1, wherein a horizontal distance of each second adhesive element is the same as a distance between adjacent second adhesive elements.

6. The flexible display apparatus according to claim 1, wherein each of the deformation preventing elements has a vertical thickness same as the protective film.

7. The flexible display apparatus according to claim 1, wherein a horizontal distance of each deformation preventing element is smaller than a distance between adjacent deformation preventing elements.

8. The flexible display apparatus according to claim 7, wherein the horizontal distance of each deformation preventing element is smaller than a horizontal distance of each second adhesive element.

9. A flexible display apparatus comprising:
a light-emitting device on a device substrate;
an encapsulating layer on the device substrate, the encapsulating layer covering the light-emitting device;
a barrier layer on the encapsulating layer;
a protective film on the barrier layer, the protective film including penetrating holes which extend in parallel;
a first adhesive element between the barrier layer and the protective film, the first adhesive element having a modulus of elasticity higher than the protective film;
deformation preventing elements in the penetrating holes of the protective film, the deformation preventing elements having a modulus of elasticity higher than the protective film; and
second adhesive elements between the barrier layer and the deformation preventing elements, the second adhesive elements having a modulus of elasticity lower than the deformation preventing elements.

10. The flexible display apparatus according to claim 9, wherein a vertical thickness of each second adhesive element is the same as a vertical thickness of the first adhesive element.

11. The flexible display apparatus according to claim 9, wherein a side surface of each second adhesive element is vertically aligned with a side surface of each deformation preventing element.

12. The flexible display apparatus according to claim 11, wherein the second adhesive elements include a material same as the deformation preventing elements, and
wherein a density of each second adhesive element is lower than a density of each deformation preventing element.

13. The flexible display apparatus according to claim 9, wherein the modulus of elasticity of the second adhesive elements is smaller than the modulus of elasticity of the protective film.

14. The flexible display apparatus according to claim 9, wherein a modulus of elasticity of the first adhesive element is smaller than the modulus of elasticity of the deformation preventing elements.

\* \* \* \* \*